(12) United States Patent
Kajihara et al.

(10) Patent No.: US 11,302,597 B2
(45) Date of Patent: Apr. 12, 2022

(54) SEMICONDUCTOR DEVICE, AND POWER CONVERSION DEVICE INCLUDING THE SEMICONDUCTOR DEVICE

(71) Applicant: Mitsubishi Electric Corporation, Tokyo (JP)

(72) Inventors: Takanobu Kajihara, Tokyo (JP); Katsuhiko Omae, Tokyo (JP); Takashi Nagao, Tokyo (JP); Masayuki Funakoshi, Tokyo (JP); Norio Emi, Tokyo (JP); Atsuki Fujita, Tokyo (JP); Yuki Okabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/617,233

(22) PCT Filed: Sep. 21, 2017

(86) PCT No.: PCT/JP2017/034019
§ 371 (c)(1),
(2) Date: Nov. 26, 2019

(87) PCT Pub. No.: WO2019/058473
PCT Pub. Date: Mar. 28, 2019

(65) Prior Publication Data
US 2021/0125891 A1  Apr. 29, 2021

(51) Int. Cl.
*H01L 23/36* (2006.01)
*H01L 23/367* (2006.01)
(Continued)

(52) U.S. Cl.
CPC ........ *H01L 23/367* (2013.01); *H01L 23/3135* (2013.01); *H01L 23/49517* (2013.01);
(Continued)

(58) Field of Classification Search
CPC ............ H01L 23/367; H01L 23/49534; H01L 23/3135; H01L 23/49517; H01L 23/49548;
(Continued)

(56) References Cited

U.S. PATENT DOCUMENTS 5,041,902 A * 8/1991 McShane .......... H01L 23/49541
257/706
5,703,399 A * 12/1997 Majumdar ............ H01L 21/565
257/675

(Continued)

FOREIGN PATENT DOCUMENTS

CN   105990275 A   10/2016
EP   0 774 782 A2   5/1997
(Continued)

OTHER PUBLICATIONS

International Search Report for PCT/JP2017/034019, dated Dec. 5, 2017.
(Continued)

*Primary Examiner* — Charles D Garber
*Assistant Examiner* — S M Sohel Imtiaz
(74) *Attorney, Agent, or Firm* — Sughrue Mion, PLLC; Richard C. Turner (57) ABSTRACT

A semiconductor device is provided with a heat dissipating face side skirt portion, which is a frame-form projection, on a heat dissipating face of a lead frame. Because of this, creepage distance increases with a small increase in an amount of resin, and insulating properties improve. Also, the heat dissipating face side skirt portion is molded via two transfer molding steps, wettability of the second molding resin with respect to a first molding resin and the lead frame increases, and adhesion improves. Furthermore, an end face of an inner lead is exposed in an element sealing portion on (Continued)

a mounting face side, and covered with a second thin molded portion molded using the second molding resin, whereby heat generated in a semiconductor element can efficiently be caused to escape from faces of both a first thin molded portion and the second thin molded portion, because of which heat dissipation improves.

12 Claims, 9 Drawing Sheets

(51) Int. Cl.
*H02K 11/33* (2016.01)
*H01L 23/31* (2006.01)
*H01L 23/495* (2006.01)
*H02M 7/00* (2006.01)
*H02M 7/537* (2006.01)

(52) U.S. Cl.
CPC ........ *H01L 23/49534* (2013.01); *H02K 11/33* (2016.01); *H02M 7/003* (2013.01); *H02M 7/537* (2013.01)

(58) Field of Classification Search
CPC ........... H01L 21/4821; H01L 23/49524; H01L 21/565; H01L 23/295; H01L 23/3107; H01L 23/28; H01L 23/29; H01L 23/31; H01L 25/07; H01L 25/18; H01L 2924/181; H02K 11/33; H02M 7/003; H02M 7/537; H02M 7/48
See application file for complete search history.

(56) References Cited

U.S. PATENT DOCUMENTS

| | | | |
|---|---|---|---|
| 11,049,790 B2 * | 6/2021 | Fuergut | H01L 21/52 |
| 2014/0027891 A1 * | 1/2014 | Kimura | H01L 21/561 |
| | | | 257/675 |
| 2014/0210093 A1 * | 7/2014 | Wang | H01L 23/3107 |
| | | | 257/773 |
| 2015/0216083 A1 | 7/2015 | Kanazawa et al. | |
| 2015/0279763 A1 * | 10/2015 | Masunaga | H01L 21/54 |
| | | | 257/693 |
| 2015/0371921 A1 * | 12/2015 | Tanaka | H01L 21/565 |
| | | | 257/712 |
| 2016/0190034 A1 * | 6/2016 | Okamotoa | H01L 23/053 |
| | | | 257/692 |
| 2016/0276247 A1 | 9/2016 | Masunaga et al. | |
| 2017/0330809 A1 | 11/2017 | Kajihara et al. | |
| 2018/0005920 A1 | 1/2018 | Kajihara et al. | |

FOREIGN PATENT DOCUMENTS

| | | | | |
|---|---|---|---|---|
| ER | 2 937 899 A1 | | 10/2015 | |
| JP | 2015-201625 A | | 11/2015 | |
| JP | 5946962 B | * | 7/2016 | ............ H02K 11/33 |
| JP | 5946962 B2 | | 7/2016 | |
| KR | 10-2015-0048459 A | | 5/2015 | |
| WO | 2016/166834 A1 | | 10/2016 | |
| WO | 2016/166835 A1 | | 10/2016 | |

OTHER PUBLICATIONS

Communication dated Jan. 19, 2021, from the Japanese Patent Office in Application No. 2019-542882.
Communication dated May 29, 2020 from European Patent Office in EP Application No. 17925881.9.
Office Action dated May 28, 2021 from the Intellectual Property Office of India in IN Application No. 201927047169.

* cited by examiner

SEMICONDUCTOR DEVICE, AND POWER CONVERSION DEVICE INCLUDING THE SEMICONDUCTOR DEVICE

CROSS REFERENCE TO RELATED APPLICATIONS

This application is a National Stage of International Application No. PCT/JP2017/034019 filed Sep. 21, 2017.

TECHNICAL FIELD

The present invention relates to a semiconductor device, and a power conversion device including the semiconductor device, and relates in particular to a both-face heat dissipating semiconductor device, the whole of which is sealed with a molding resin.

BACKGROUND ART

A power semiconductor device is such that a semiconductor element such as an IGBT (insulated gate bipolar transistor), a MOSFET (metal-oxide-semiconductor field effect transistor), an IC chip, or an LSI chip is die-bonded to an external terminal lead frame, after which an electrode of the semiconductor element and the external terminal are electrically connected using a wire or an inner lead, and an input and output of signals from and to an exterior is carried out.

Also, a resin-molded type of semiconductor device is such that a face of the lead frame on a side on which the semiconductor element is mounted (a mounting face), and a heat dissipating face on an opposite side, are sealed with a molding resin in a molding step. As the power semiconductor device includes a high heat generating element in an interior thereof, high heat dissipation is required of the molding resin.

As an existing resin-molded type of semiconductor device, there is a resin-molded type of semiconductor device such that the mounting face side of the lead frame is sealed with a low stress resin used as a general integrated circuit molding resin, and the heat dissipating face side is sealed with a high heat dissipating resin for which mainly an alumina filler is used, and which has thermal conductivity of 3 W/m·K or higher. Also, in Patent Document 1, a power conversion device including a motor and an inverter is such that one face of a power module of the inverter is in contact with a metal frame of the motor or the inverter, another face is in contact with a heat dissipating metal plate, and heat generated in the power module is caused to escape from both faces.

CITATION LIST

Patent Literature

Patent Document 1: Japanese Patent No. 5,946,962

SUMMARY OF INVENTION

Technical Problem

Although there are existing semiconductor devices wherein the lead frame heat dissipating face side is sealed with a high heat dissipating resin, it is desirable with a view to improving heat dissipation that the mounting face side is also covered with a high heat dissipating resin. As a high heat dissipating resin is expensive, however, covering all regions, including the mounting face, with a high heat dissipating resin is not realistic in terms of cost.

Also, in Patent Document 1, a heat dissipating metal plate is brought into contact with both faces of a thin power module wherein a resin thickness is in the region of 300 μm, and a creepage distance from the metal plate to the lead frame is short. Because of this, withstand voltage is expected to be low, and there is a high possibility of an insulation failure occurring. In order to increase the creepage distance, it is necessary to reduce an area of the metal plate or to increase the resin thickness, and there is a problem in both cases in that heat dissipation decreases.

Also, assuming, for example, that the semiconductor element is 100 μm and the lead frame is 100 μm in a case of a semiconductor device wherein an overall resin thickness is 300 μm, the thickness of the resin on the heat dissipating face side is less than 100 μm. Although it is necessary to reduce the resin thickness in order to improve heat dissipation, there is a problem when molding to a small thickness of less than 100 μm in the molding step in that a void or a non-filling with resin is liable to occur, resulting in a failure.

The invention, in consideration of the heretofore described problems, has an object of obtaining a both-face heat dissipating semiconductor device in which two kinds of resin are used, the semiconductor device being such that creepage distance is secured, heat dissipation and insulating properties are excellent, and a cost is low.

Solution to Problem

A semiconductor device according to the invention includes a lead frame on which a semiconductor element is mounted, an inner lead connected to an electrode of the semiconductor element, and a first resin and a second resin that seal one portion of the lead frame, the semiconductor element, and the inner lead. When a face on a side of the lead frame on which the semiconductor element is mounted is assumed to be a mounting face and a face on a side opposite to that of the mounting face is assumed to be a heat dissipating face, a frame-form projection is provided in an outer peripheral end portion of the heat dissipating face, two opposing sides of the frame-form projection and a first thin molded portion that covers a region between the two sides are integrally molded using the second resin, and two other opposing sides of the frame-form projection are molded using the first resin. An element sealing portion that covers one portion of the inner lead and the semiconductor element is molded on the mounting face using the first resin, and a second thin molded portion that covers one portion of a surface of the element sealing portion and the inner lead exposed in the element sealing portion is molded using the second resin.

Advantageous Effects of Invention

According to the invention, a frame-form projection is provided on a heat dissipating face of a lead frame, whereby creepage distance increases with a small increase in an amount of resin, and insulating properties improve. Also, two opposing sides of the frame-form projection and a first thin molded portion are integrally molded using a second resin, and two other opposing sides of the frame-form projection are molded using a first resin, whereby fluidity of the second resin to the first thin molded portion increases, and wettability of the second resin increases, compared with a case in which all four sides of the frame-form projection are molded at one time using the second resin. Because of this, adhesion between the first thin molded portion and the lead frame increases, and detachment or fragmentation of the first thin molded portion is unlikely to occur. Furthermore, the inner lead is covered with a second thin molded portion, whereby heat generated in a semiconductor element can efficiently be caused to escape from faces of both the first thin molded portion and the second thin molded portion. For the reasons above, according to the invention, a highly reliable semiconductor device with excellent heat dissipation and insulating properties is obtained at a low cost.

Object, characteristics, aspects, and advantageous effects of the invention other than described above would be apparent from the following detailed description of the invention with reference to the accompanied drawings.

DESCRIPTION OF EMBODIMENTS

First Embodiment

Figure 1:
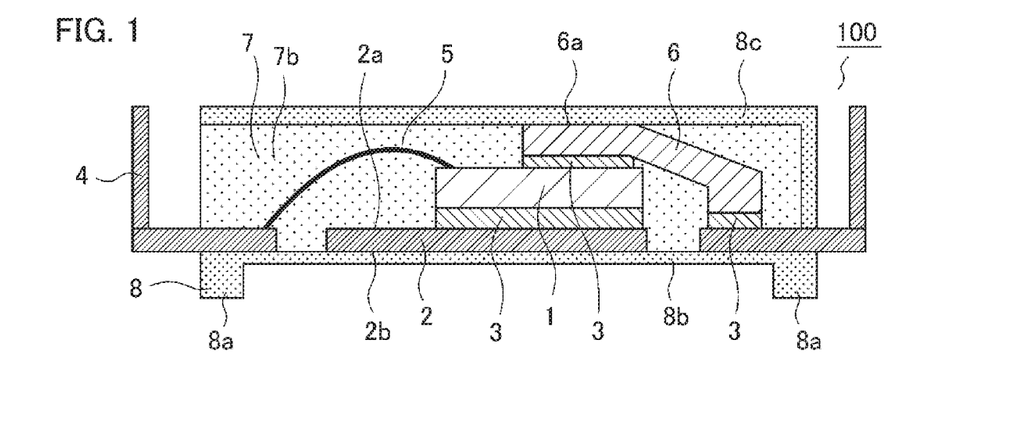
FIG. 1 is a sectional view showing a semiconductor device according to a first embodiment of the invention.
Figure 2:
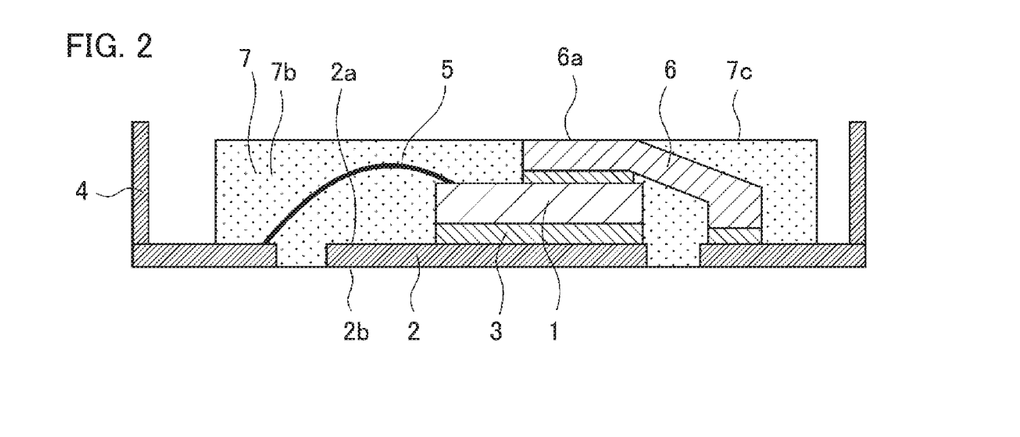
FIG. 2 is a sectional view showing the semiconductor device after a first transfer molding step in the first embodiment of the invention.
Figure 3:
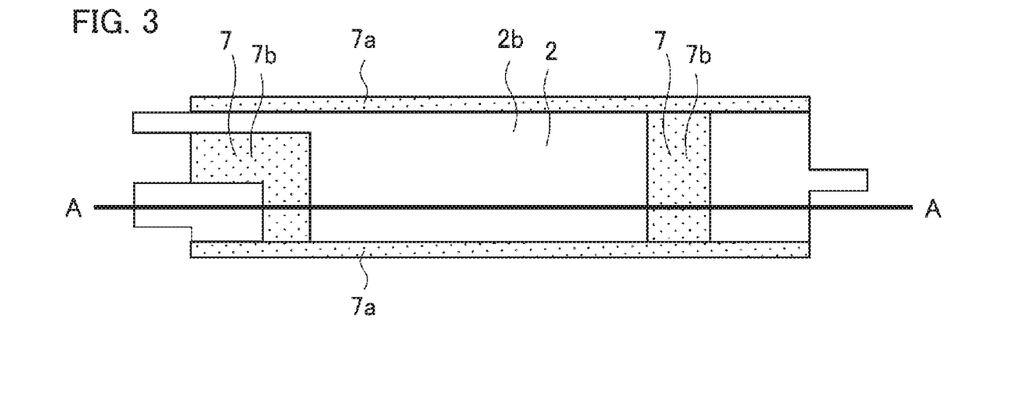
FIG. 3 is a plan view of the semiconductor device seen from a heat dissipating face side after the first transfer molding step in the first embodiment of the invention.
Figure 4:
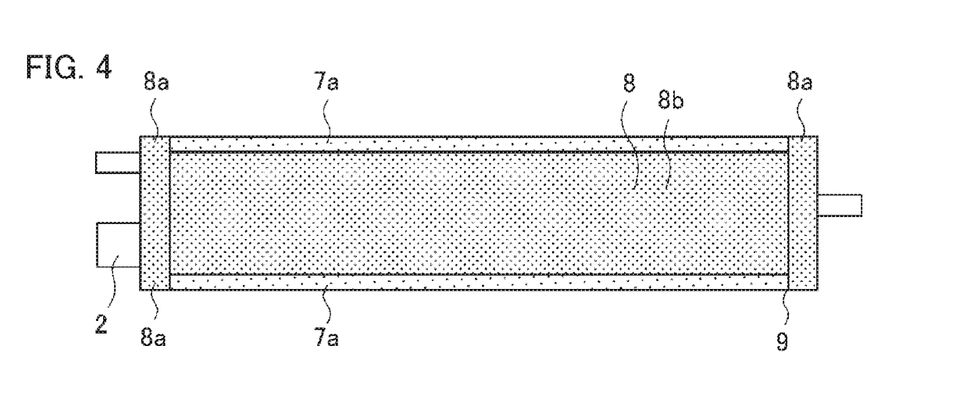
FIG. 4 is a plan view of the semiconductor device seen from the heat dissipating face side after a second transfer molding step in the first embodiment of the invention.

Hereafter, a semiconductor device according to a first embodiment of the invention will be described, based on the drawings. FIG. 1 is a sectional view showing a configuration of a resin-molded type of semiconductor device according to the first embodiment, FIG. 2 is a sectional view of the semiconductor device after a first transfer molding step, FIG. 3 is a plan view of the semiconductor device after the first transfer molding step seen from a heat dissipating face side, and FIG. 4 is a plan view of the semiconductor device after a second transfer molding step seen from the heat dissipating face side. The same reference sign is allotted to identical or corresponding portions in the drawings.

A semiconductor device 100 according to the first embodiment is a both-face heat dissipating semiconductor device sealed using two kinds of resin. As shown in FIG. 1, the semiconductor device 100 is configured to include a lead frame 2 on which a semiconductor element 1 is mounted, an external terminal 4, a wire 5 and an inner lead 6 connected to an electrode of the semiconductor element 1, a first molding resin 7, which is a first resin, and a second molding resin 8, which is a second resin.

In the following description, a face of the lead frame 2 on the side on which the semiconductor element 1 is mounted is a mounting face 2a, and a face on the side opposite to that of the mounting face 2a is a heat dissipating face 2b. In the example shown in FIG. 1, a face on an upper side of the lead frame 2 is the mounting face 2a, and a face on a lower side is the heat dissipating face 2b. The semiconductor element 1, which is an IGBT, a MOSFET, an IC chip, an LSI chip, or the like, is mounted on the mounting face 2a across a joining member 3 such as solder or silver. The lead frame 2 is a copper plate or a copper alloy plate, and a surface thereof is coated with a metal plating (not shown) of gold, silver, nickel, tin, or the like.

An electrode pad of the semiconductor element 1 is electrically connected to the external terminal 4 across the wire 5, which is connected using wire bonding, or the inner lead 6, which is fabricated of a copper plate or a copper alloy plate material, and carries out an input and output of signals from and to an exterior. The wire 5 and the inner lead 6 are interchangeable. The wire 5 is formed of gold, silver, aluminum, copper, or the like, and a wire diameter is in the region of approximately 20 μm to 500 μm.

One portion of the lead frame 2, the semiconductor element 1, the wire 5, and the inner lead 6 are sealed with the first molding resin 7 and the second molding resin 8. Both the first molding resin 7 and the second molding resin 8 are thermosetting epoxy resins, or the like. Note that a high heat dissipating resin with higher thermal conductivity than that of the first molding resin 7 is used for the second molding resin 8, which mainly covers the heat dissipating face 2b. The thermal conductivity of the second molding resin 8 is 2 W/m·K to 12 W/m·K. Also, a low stress resin that is a general integrated circuit molding resin is used for the first molding resin 7, which mainly covers the mounting face 2a.

A heat dissipating face side skirt portion, which is a frame-form projection of a thickness in the region of approximately 0.3 mm to 2 mm molded using the first molding resin 7 and the second molding resin 8, is provided in an outer peripheral end portion of the heat dissipating face 2b. Two opposing sides of the heat dissipating face side skirt portion, and a first thin molded portion 8b that covers a region between the two sides, are integrally molded using the second molding resin 8, and two other opposing sides are molded using the first molding resin 7.

Specifically, as shown in FIG. 4, the heat dissipating face side skirt portion is configured of first skirt portions 7a molded using the first molding resin 7 and second skirt portions 8a molded using the second molding resin 8. The first skirt portion 7a and the second skirt portion 8a are such that a sectional form cut in a direction perpendicular to the sides is a rectangle, a square, or a trapezoid. A corner portion of the sectional form may be rounded, or the sectional form may be an arc form.

The first thin molded portion 8b, of a thickness in the region of approximately 0.02 mm to 0.3 mm, is molded integrally with the second skirt portions 8a, using the second molding resin 8, between the second skirt portions 8a. The first skirt portions 7a and the second skirt portions 8a are joined at resin joint portions 9 in four places.

Meanwhile, an element sealing portion 7b that covers one portion of the inner lead 6 and the semiconductor element 1 is molded on the mounting face 2a using the first molding resin 7. As shown in FIG. 2, the element sealing portion 7b has an upper face 7c, which is a flat face parallel to the mounting face 2a, and four side faces perpendicular to the upper face 7c. Note that the upper face 7c and the four side faces of the element sealing portion 7b need not necessarily be perpendicular to each other. Also, the inner lead 6 has an end face 6a parallel to the upper face 7c of the element sealing portion 7b. The upper face 7c of the element sealing portion 7b and the end face 6a of the inner lead 6 are formed so that heights thereof from the mounting face 2a are equal.

Furthermore, a second thin molded portion 8c, which covers one portion of the surface of the element sealing portion 7b and the inner lead 6 exposed in the element sealing portion 7b, is molded using the second molding resin 8. In the example shown in FIG. 1, the second thin molded portion 8c covers the upper face 7c of the element sealing portion 7b, the end face 6a of the inner lead 6, and one side face perpendicular to the upper face 7c of the element sealing portion 7b.

Figure 5:
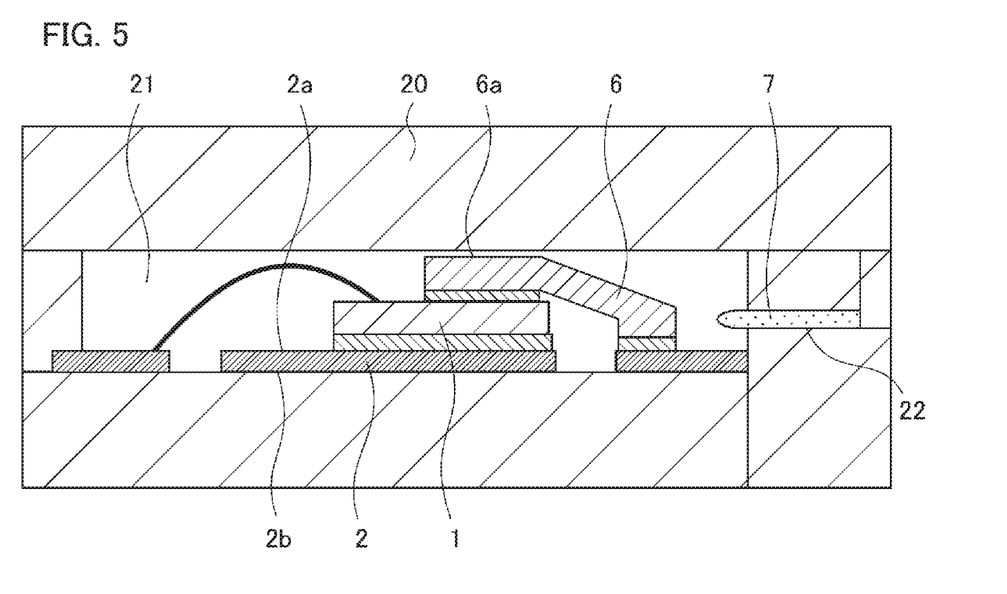
FIG. 5 is a sectional view showing the first transfer molding step of the semiconductor device according to the first embodiment of the invention.
Figure 6:
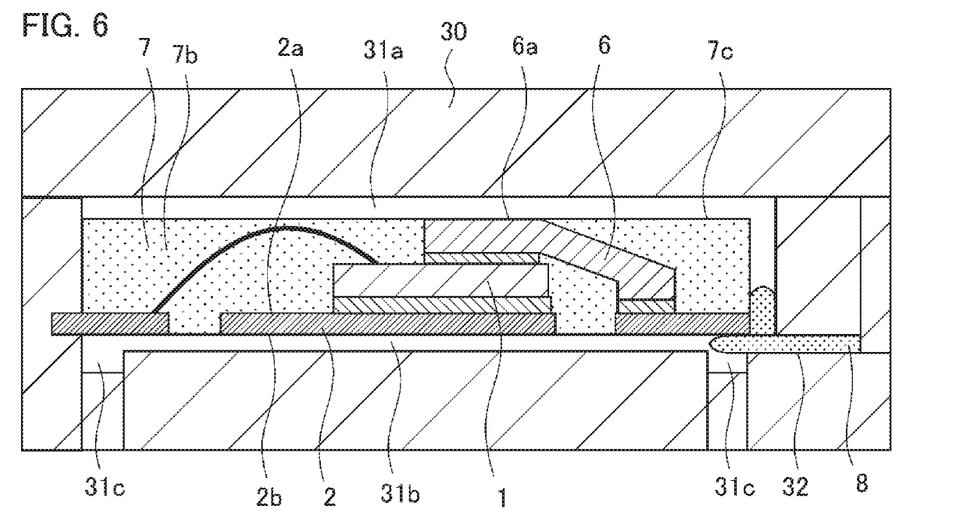
FIG. 6 is a sectional view showing the second transfer molding step of the semiconductor device according to the first embodiment of the invention.

A molding step of the semiconductor device 100 will be described using FIG. 5 and FIG. 6. Manufacture of the semiconductor device 100 includes two transfer molding steps, wherein FIG. 5 shows the first transfer molding step, and FIG. 6 shows the second transfer molding step. The semiconductor device shown in FIG. 6 is a sectional view in a position indicated by A-A in FIG. 3.

In the first transfer molding step, as shown in FIG. 5, the first molding resin 7, which is melted by heat and pressure applied in a first molding die 20, is injected through an upper gate 22 into a cavity 21 in which the lead frame 2 is installed. The first molding resin 7 flows to the mounting face 2a side of the lead frame 2, molding the element sealing portion 7b by filling the cavity 21, and in addition, flows into cavities (not shown) corresponding to the first skirt portions 7a, thereby molding the first skirt portions 7a.

When using the first molding die 20 shown in FIG. 5, the end face 6a of the inner lead 6 is covered with the first molding resin 7 after the first transfer molding step. Because of this, the first molding resin 7 is removed by a mechanical grinding or a laser irradiation in a subsequent process, causing the end face 6a of the inner lead 6 to be exposed.

As shown in FIG. 2, the element sealing portion 7b that seals the semiconductor element 1 has been molded using the first molding resin 7 on the mounting face 2a of the lead frame 2 when the first transfer molding step and the subsequent process are finished, and the end face 6a of the inner lead 6 is exposed in the element sealing portion 7b. Also, as shown in FIG. 3, the first skirt portions 7a, which are two sides parallel to the upper gate 22, have been molded using the first molding resin 7 on the heat dissipating face 2b.

Continuing, the second transfer molding step is implemented. In order to increase adhesion between the first molding resin 7 and the second molding resin 8, a UV processing, a plasma processing, or a laser processing may be implemented on the first molding resin 7 after the first transfer molding step. As shown in FIG. 6, the lead frame 2 when the first transfer molding step is finished is installed in an interior of a second molding die 30.

The interior of the second molding die 30 in which the lead frame 2 is installed has a cavity 31a corresponding to the second thin molded portion 8c above the element sealing portion 7b molded using the first molding resin 7. Also, the interior of the second molding die 30 has a cavity 31b corresponding to the first thin molded portion 8b, and cavities 31c corresponding to the second skirt portions 8a, on the heat dissipating face 2b side of the lead frame 2.

The second molding resin 8, which is melted by heat and pressure applied in the second molding die 30, passes through the cavity 31c that is in a vicinity of a lower gate 32, and flows into the cavity 31b. At this time, the second molding resin 8 accumulates once in the cavity 31c in the vicinity of the lower gate 32, because of which the second molding resin 8 can flow evenly into the cavity 31b. The second molding resin 8 that has passed through the cavity 31b further flows into the cavity 31c on an opposite side farthest from the lower gate 32, which is a last-filled portion. At this time, curing of the second molding resin 8 is advancing and viscosity is increasing, but the cavity 31c has a greater thickness and a smaller flow resistance than the cavity 31b, because of which the second molding resin 8 flows easily.

Also, simultaneously with flowing to the cavities 31b and 31c, the second molding resin 8 flows to the cavity 31a between the upper face 7c of the element sealing portion 7b, molded using the first molding resin 7, and the second molding die 30. Taking fluidity and heat dissipation of the resin into consideration, a thickness of the second thin molded portion 8c may be in the region of twice that of the first thin molded portion 8b. Assuming that a thickness of the element sealing portion 7b is at least 0.4 mm, insulating properties on the mounting face 2a side can be secured by the thickness of the second thin molded portion 8c being added to that of the element sealing portion 7b. The second skirt portions 8a, the first thin molded portion 8b, and the second thin molded portion 8c are molded using the second molding resin 8 in the second transfer molding step, and the molded article is removed from the second molding die 30.

As shown in FIG. 4, the second skirt portions 8a on two sides, including a side nearest the lower gate 32, and the first thin molded portion 8b that covers the region between the two sides, have been integrally molded using the second molding resin 8 on the heat dissipating face 2b after the second transfer molding step. In the first embodiment, the first skirt portions 7a molded using the first molding resin 7 are positioned on long side sides, and the second skirt portions 8a molded using the second molding resin 8 are positioned on short side sides, but this may be reversed depending on gate positions in the molding die used.

Figure 7:
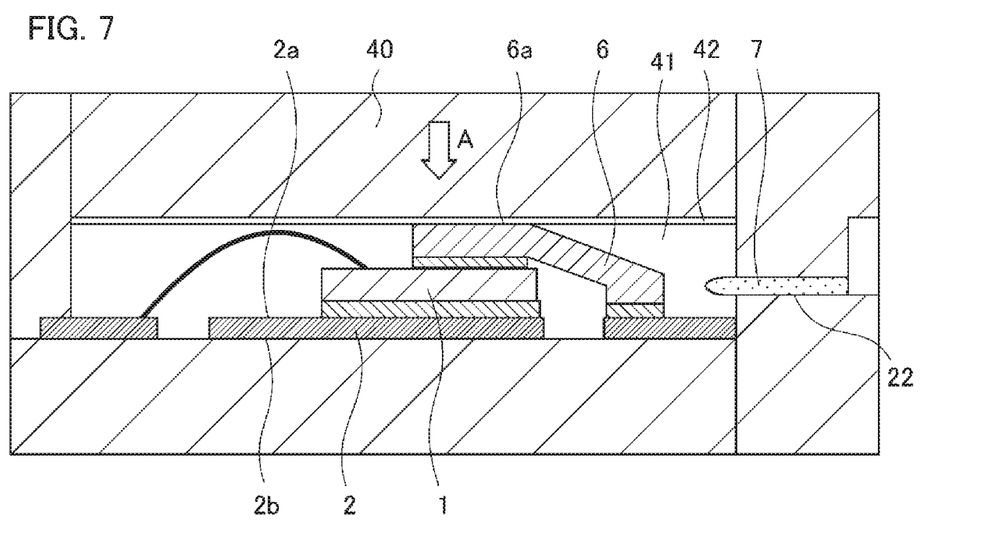
FIG. 7 is a sectional view showing a first compression molding step of the semiconductor device according to the first embodiment of the invention.

A molded article such that the end face 6a of the inner lead 6 is in a state exposed in the element sealing portion 7b can be manufactured by compression molding being implemented in the first transfer molding step. As shown in FIG. 7, a film 42 made of a thermoplastic fluororesin of a thickness in the region of approximately 40 μm to 200 μm is caused to be adsorbed in advance onto an internal surface of a compression molding die 40. The film 42 prevents the melted first molding resin 7 from encroaching into a moving portion of the molding die 40.

An upper portion of the molding die 40 is a moving portion, moves in a direction of an arrow A, and stops in a predetermined position on an upper face of the inner lead 6 while pressurizing a cavity 41. The first molding resin 7 in granule form may be installed in advance in the cavity in an interior of the molding die 40, or a normal transfer-use tablet-form resin may be injected from the upper gate 22, and caused to flow into the cavity 41.

In order to expose the end face 6a of the inner lead 6 using the first molding die 20 shown in FIG. 5, the first molding die 20 and the inner lead 6 need to be brought into contact. However, as there is variation in the heights of the semiconductor element 1 and the inner lead 6 after mounting, there is a possibility of stress being exerted on the semiconductor element 1, and the semiconductor element 1 being destroyed, when the height after mounting is greater than a reference value, and a gap appears between the first molding die 20 and the inner lead 6 when the height is less than the reference value, because of which resin burr occurs on the first molding resin 7.

In response to this, compression molding is such that the film 42 installed in advance in the molding die 40 is pressurized and becomes thinner, whereby variation in the heights of the semiconductor element 1 and the inner lead 6 is absorbed, and the gap between the molding die 40 and the inner lead 6 is filled, because of which no resin burr occurs, and the end face 6a of the inner lead 6 can be exposed.

By the heat dissipating face side skirt portion being molded via the second transfer molding step in this way, fluidity of the second molding resin 8 to the first thin molded portion 8b improves, wettability of the second molding resin 8 with respect to the first molding resin 7 and the lead frame 2 increases, and adhesion improves.

As a comparative example of the first embodiment, a description will be given of a case wherein all four sides of a heat dissipating face side skirt portion and a first thin molded portion are molded simultaneously in a first transfer molding step. In a molding die, a thickness of the heat dissipating face side skirt portion is greater than that of the first thin molded portion, and flow resistance is smaller, because of which melted resin flows first to the four sides of the heat dissipating face side skirt portion, and the first thin molded portion is a last-filled portion.

As a resin whose curing is advancing and whose viscosity has increased flows into the last-filled portion, it is difficult for the resin to flow evenly into the first thin molded portion, which has a greater flow resistance. Also, as resins that have flowed first into the four sides of the heat dissipating face side skirt portion converge in the first thin molded portion, a weld line is formed, and strength and insulating properties of the first thin molded portion are inferior compared with a case in which the first thin molded portion is formed in two transfer molding steps, as in the first embodiment.

Figure 8:
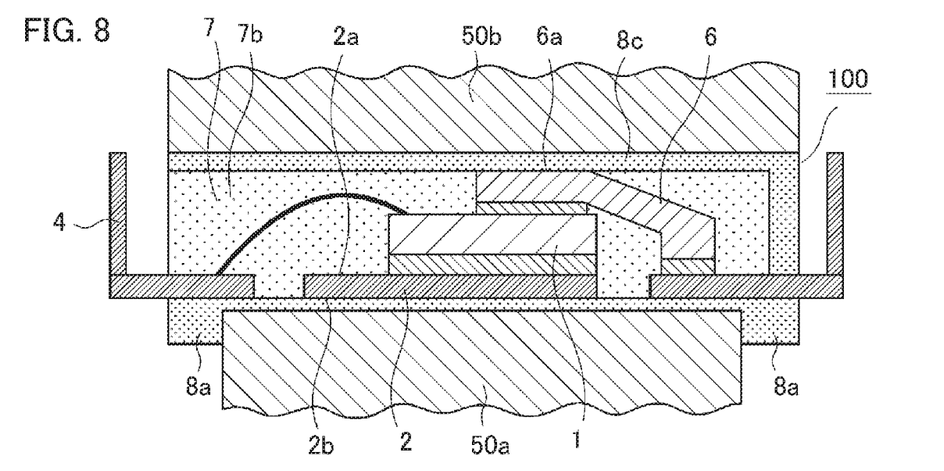
FIG. 8 is a sectional view showing a state wherein a heatsink is disposed in the semiconductor device according to the first embodiment of the invention.

The semiconductor device 100 according to the first embodiment is used in a power conversion device that includes an inverter that converts power and a motor that converts electrical energy into mechanical energy. For example, the semiconductor device 100 is incorporated in an inverter of an electric motor wherein a motor and an inverter are integrated in a vehicle-mounted application. In this case, as shown in FIG. 8, a heat dissipating face heatsink 50a and a mounting face heatsink 50b are in contact with the semiconductor device 100 across a thermal grease (not shown). The heat dissipating face heatsink 50a is of a size such as to be housed within the frame of the heat dissipating face side skirt portion. The heat dissipating face heatsink 50a and the mounting face heatsink 50b are integrated with an inverter frame or a motor frame, which have a large heat capacity, or are joined by screwing or the like to the frame bodies.

Figure 9:
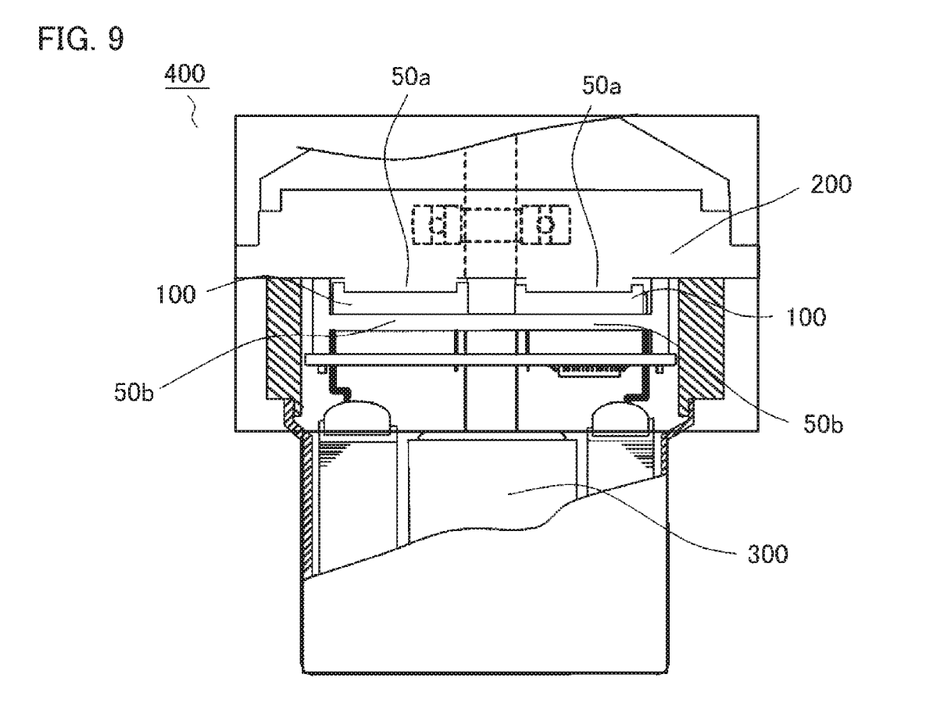
FIG. 9 is a sectional view showing an electric motor including the semiconductor device according to the first embodiment of the invention.
Figure 10:
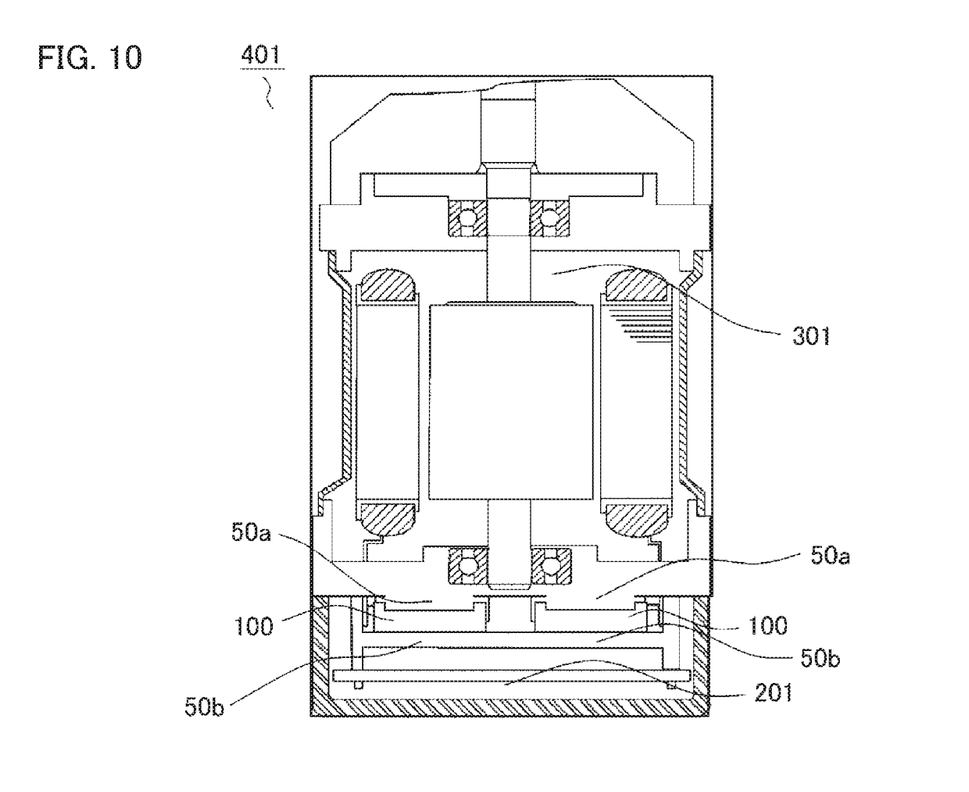
FIG. 10 is a sectional view showing another electric motor including the semiconductor device according to the first embodiment of the invention.

FIG. 9 and FIG. 10 show electric motors including the semiconductor device 100 according to the first embodiment. Electric motors 400 and 401 shown in FIG. 9 and FIG. 10 may be any of an electric power steering motor and inverter integrated unit, a mild hybrid ISG (integrated starter generator), or a strong hybrid motor and inverter integrated unit. Motors 300 and 301 have a stator and a rotor disposed in an interior of a metal frame, and inverters 200 and 201 have a motor drive circuit.

The electric motor 400 shown in FIG. 9 is such that the motor 300 and the inverter 200 are integrated, and the heat dissipating face heatsink 50a and the mounting face heatsink 50b are integrated with the frame of the inverter 200. Also, the electric motor 401 shown in FIG. 10 is such that the motor 301 and the inverter 201 are integrated, and the heat dissipating face heatsink 50a and the mounting face heatsink 50b are integrated with the frame of the motor 301 and the frame of the inverter 201 respectively. The mounting face heatsink 50b may be integrated with the frame of the motor 301, and the heat dissipating face heatsink 50a with the frame of the inverter 201, which is the reverse of the example shown in FIG. 10. Also, a heatsink and a frame may be separate bodies, brought into contact across a thermal grease or the like, and the heatsink fixed to the frame by screwing.

In the first embodiment, the surface of the lead frame 2 is coated with a metal plating of gold, silver, nickel, tin, or the like, but there is also a case in which the surface is not coated. Also, although a thickness of the lead frame 2 is uniform, a lead frame such that the thickness partially differs may be used (note that cost increases in this case). Also, although a surface of the inner lead 6 is not coated with a metal plating, the surface may be coated.

Also, in the first embodiment, the upper face 7c of the element sealing portion 7b and one side face nearest to the lower gate 32 are covered with the second molding resin 8, but the disposition of the second molding resin 8 is not limited to this. The second molding resin 8, which is a high heat dissipating resin, is expensive, because of which it is sufficient that disposition is determined with consideration to heat dissipation and cost.

According to the first embodiment, a heat dissipating face side skirt portion is provided on the heat dissipating face 2b of the lead frame 2, whereby strength of an outer peripheral end portion of the lead frame 2, on which high pressure of resin molding is exerted, can be secured, in addition to which the creepage distance increases with a small increase in the amount of resin, and the insulating properties improve. Because of this, the semiconductor device 100 according to the first embodiment is appropriate as a power module with a withstand voltage of 600V or higher in which an IGBT is used as the semiconductor element 1.

Also, the first skirt portions 7a are molded using the first molding resin 7, and the second skirt portions 8a and the first thin molded portion 8b are integrally molded using the second molding resin 8, whereby the fluidity of the second molding resin 8 increases, wettability of the second molding resin 8 with respect to the lead frame 2 and the first molding resin 7 increases, and adhesion improves, compared with a case in which all four sides of the heat dissipating face side skirt portion are molded at one time using the second molding resin 8. Because of this, adhesion between the first thin molded portion 8b and the lead frame 2 increases, and detachment or fragmentation of the first thin molded portion 8b is unlikely to occur.

Furthermore, the end face 6a of the inner lead 6 is covered with the second thin molded portion 8c, whereby heat generated in the semiconductor element 1 can efficiently be caused to escape from faces of both the first thin molded portion 8b and the second thin molded portion 8c, and heat dissipation improves. Also, the mounting face 2a side is such that only the second thin molded portion 8c is molded using the second molding resin 8, because of which heat dissipation can be improved while restricting the amount of expensive high heat dissipating resin used. For the reasons above, according to the first embodiment, the highly reliable semiconductor device 100 with excellent heat dissipation and insulating properties is obtained at a low cost.

Second Embodiment

Figure 11:
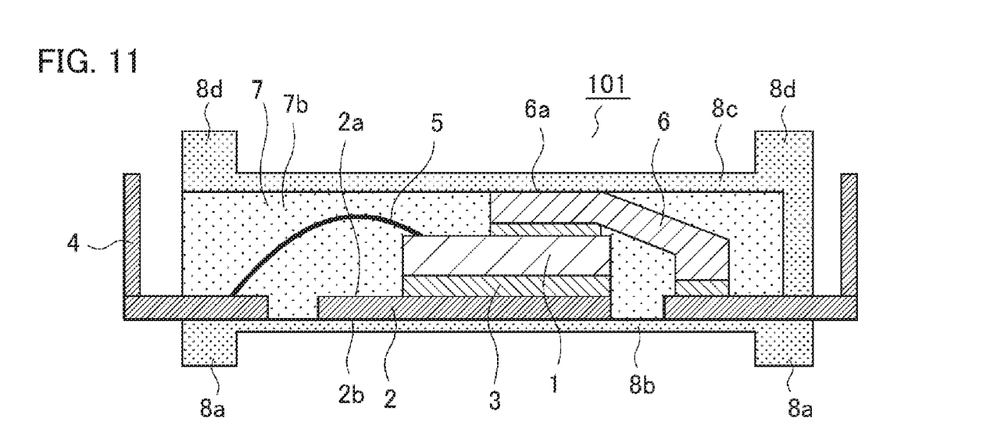
FIG. 11 is a sectional view showing semiconductor device according to a second embodiment of the invention.
Figure 12:
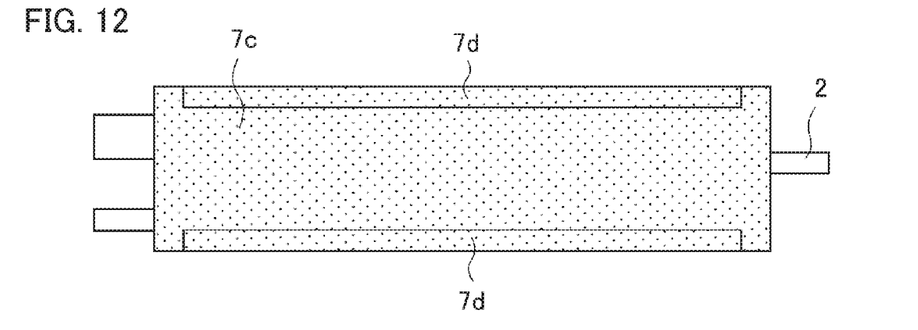
FIG. 12 is a plan view of the semiconductor device seen from a mounting face side after a first transfer molding step in the second embodiment of the invention.
Figure 13:
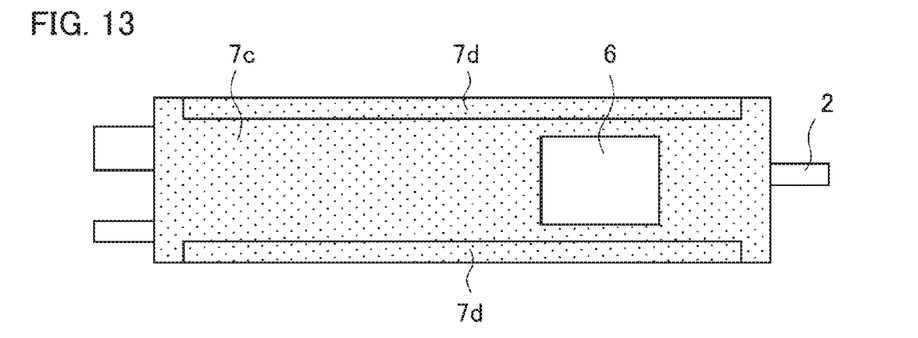
FIG. 13 is a plan view wherein the semiconductor device in which an inner lead is exposed is seen from the mounting face side after the first molding step in the second embodiment of the invention.

FIG. 11 is a sectional view showing a configuration of a semiconductor device according to a second embodiment of the invention. Also, FIG. 12 is a plan view of the semiconductor device after a first transfer molding step seen from a mounting face side, FIG. 13 is a plan view wherein the semiconductor device in which an inner lead is exposed is seen after the first molding step from the mounting face side, and FIG. 14 is a plan view of the semiconductor device after a second transfer molding step seen from the mounting face side.

For example, in a case of a semiconductor device in which a strong hybrid IGBT is mounted, and which needs a withstand voltage of 600V or higher, a creepage distance longer than normal (for example, 1.8 mm or longer) needs to be secured. Although the creepage distance increases by the thickness of the element sealing portion 7b being increased, the module increases in size, the amount of resin used increases, and cost increases. In response to this kind of problem, the creepage distance can be increased at a low cost by providing a frame-form projection on the mounting face 2a side too, in the same way as on the heat dissipating face 2b side.

A semiconductor device 101 according to the second embodiment is such that a mounting face side skirt portion, which is a mounting face side frame-form projection of a thickness in the region of approximately 0.3 mm to 2 mm, is provided in an outer peripheral end portion of the upper face 7c of the element sealing portion 7b. Two opposing sides of the mounting face side skirt portion and the second thin molded portion 8c, which covers a region between the two sides, are integrally molded using the second molding resin 8, and two other opposing sides of the mounting face side skirt portion are molded using the first molding resin 7. As other configurations are the same as those of the semiconductor device 100 according to the first embodiment, a description thereof will be omitted here.

Figure 14:
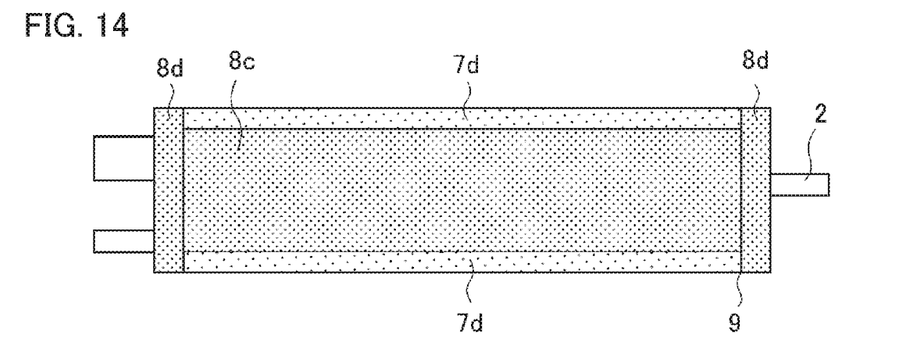
FIG. 14 is a plan view of the semiconductor device seen from the mounting face side after a second transfer molding step in the second embodiment of the invention.

As shown in FIG. 14, the mounting face side skirt portion is configured of third skirt portions 7d molded using the first molding resin 7 and fourth skirt portions 8d molded using the second molding resin 8. The third skirt portion 7d and the fourth skirt portion 8d are such that a sectional form cut in a direction perpendicular to the sides is a rectangle, a square, or a trapezoid. A corner portion of the sectional form may be rounded, or the sectional form may be an arc form.

Also, the second thin molded portion 8c, of a thickness in the region of approximately 0.02 mm to 0.3 mm, is molded integrally with the fourth skirt portions 8d, using the second molding resin 8, between the fourth skirt portions 8d. The third skirt portions 7d and the fourth skirt portions 8d are joined at resin joint portions 9 in four places.

A manufacturing process of the semiconductor device 101 according to the second embodiment will be described using FIG. 12 to FIG. 14. Manufacture of the semiconductor device 101 includes two molding steps, wherein a transfer molding step the same as in the first embodiment is implemented first. Note that an internal form of a molding die differs from that of the first embodiment.

As shown in FIG. 12, the third skirt portions 7d, which are two sides parallel to the upper gate 22, have been molded using the first molding resin 7 on the upper face 7c of the element sealing portion 7b on the mounting face 2a after the first transfer molding step. Also, the first skirt portions 7a, which are two sides parallel to the upper gate 22, have been molded using the first molding resin 7 on the heat dissipating face 2b (refer to FIG. 3).

As described in the first embodiment, a molded article when the first transfer molding step is a normal transfer molding is such that the inner lead 6 is not exposed, as shown in FIG. 12. Because of this, the first molding resin 7 needs to be removed by a mechanical grinding or a laser irradiation in a subsequent process, causing the inner lead 6 to be exposed. Meanwhile, a molded article when the first transfer molding step is a compression molding is such that the inner lead 6 is exposed, as shown in FIG. 13.

Continuing, a second transfer molding step the same as in the first embodiment is implemented. Note that an internal form of a molding die differs from that of the first embodiment. As shown in FIG. 14, the fourth skirt portions 8d on two sides, including a side nearest the lower gate 32, and the second thin molded portion 8c that covers the region between the two sides have been integrally molded using the second molding resin 8 on the upper face 7c of the element sealing portion 7b on the mounting face 2a after the second transfer molding. Also, the second skirt portions 8a on two sides, including a side nearest the lower gate 32, and the first thin molded portion 8b that covers the region between the two sides have been integrally molded using the second molding resin 8 on the heat dissipating face 2b (refer to FIG. 4).

The second embodiment is such that, in addition to the same advantages as in the first embodiment, the creepage distance is longer than in the first embodiment owing to a mounting face side skirt portion being provided, because of which the both-face heat dissipating semiconductor device 101 with a still higher withstand voltage is obtained.

Third Embodiment

Figure 15:
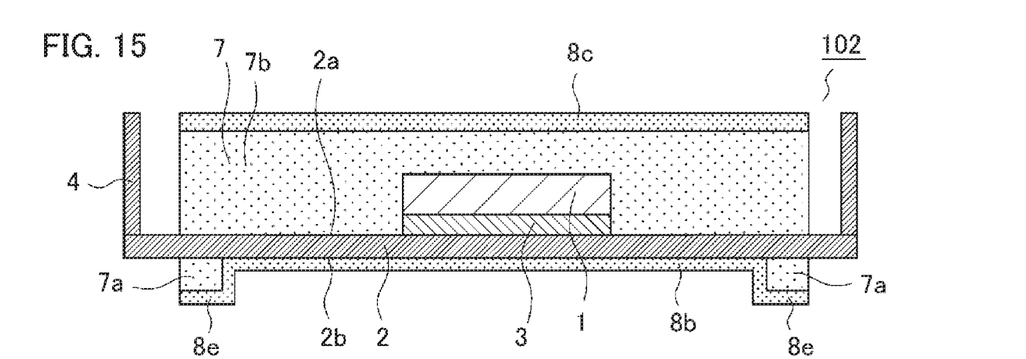
FIG. 15 is a sectional view showing a semiconductor device according to a third embodiment of the invention.
Figure 16:
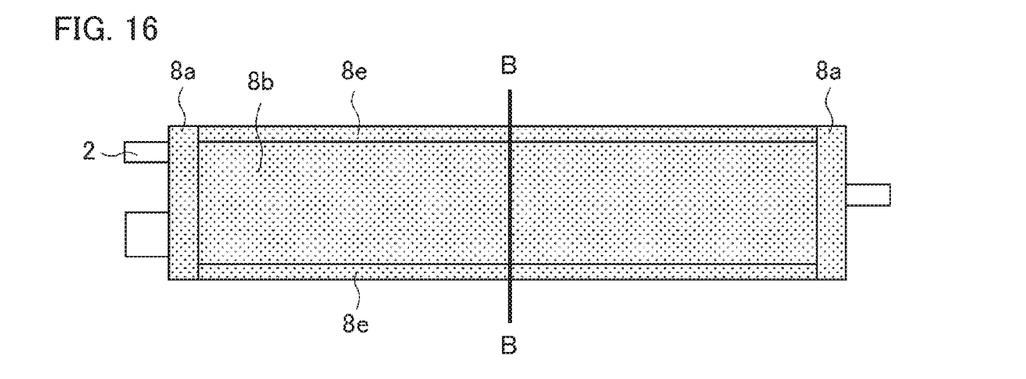
FIG. 16 is a plan view of the semiconductor device seen from a heat dissipating face side after a second transfer molding step is the third embodiment of the invention.

FIG. 15 is a sectional view showing a semiconductor device according to a third embodiment of the invention, and FIG. 16 is a plan view of the semiconductor device after a second transfer molding step seen from a heat dissipating face side. FIG. 15 is a sectional view in a position indicated by B-B in FIG. 16.

In the first embodiment and the second embodiment, a heat dissipating face side skirt portion is configured of the first skirt portions 7a molded using the first molding resin 7 and the second skirt portions 8a molded using the second molding resin 8. This kind of configuration is such that when there is detachment at an interface between the first thin molded portion 8b molded using the second molding resin 8 and the first skirt portion 7a, the creepage distance between the heat dissipating face heatsink 50a (refer to FIG. 8) and the lead frame 2 becomes equivalent to the thickness of the first thin molded portion 8b, and there is concern that the withstand voltage will drop considerably.

Because of this, a semiconductor device 102 according to the third embodiment is such that two opposing sides of a heat dissipating face side skirt portion molded using the first molding resin 7, that is, the first skirt portions 7a, are covered with fifth skirt portions 8e molded using the second molding resin 8. The fifth skirt portions 8e are molded during a second transfer molding, and cover inner side faces of the first skirt portions 7a and lower faces parallel to the heat dissipating face 2b, as shown in FIG. 15.

Because of this, the heat dissipating face 2b side of the semiconductor device 102 is such that the four sides of the heat dissipating face side skirt portion (the second skirt portions 8a and the fifth skirt portions 8e) and the first thin molded portion 8b, which covers a region among the four sides, are integrally molded using the second molding resin 8, as shown in FIG. 16. In order that heights of the second skirt portions 8a and the fifth skirt portions 8e are uniform, the heights of the first skirt portions 7a are formed to be lower than in the first embodiment.

Also, when a mounting face side skirt portion is included, as in the case of the semiconductor device 101 according to the second embodiment (refer to FIG. 14), sixth skirt portions (not shown) that cover the third skirt portions 7d molded using the first molding resin 7 may be molded using the second molding resin 8 during the second transfer molding.

The third embodiment is such that, in addition to the same advantages as in the first embodiment, the first skirt portions 7a are covered with the fifth skirt portions 8e, whereby creepage distance can be secured even when there is detachment at the interface between the first thin molded portion 8b and the first skirt portion 7a on the heat dissipating face 2b side due to production variation or the like, and the semiconductor device 102 such that insulation failures can be reduced is obtained.

Fourth Embodiment

Figure 17:
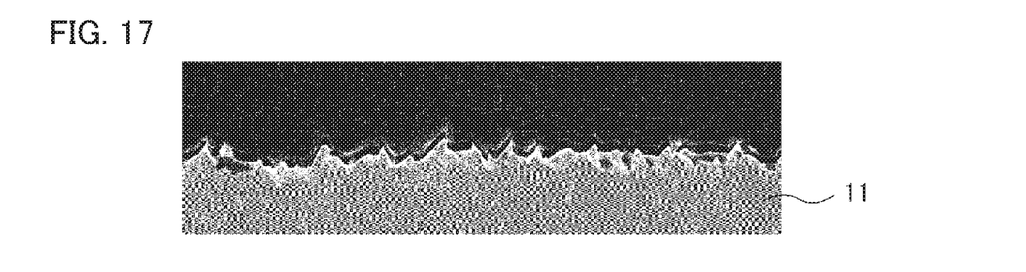
FIG. 17 is a sectional view showing a surface state of a surface-roughened inner lead in a fourth embodiment of the invention.

FIG. 17 is a sectional view showing a surface state of a surface-roughened inner lead used in a semiconductor device according to a fourth embodiment of the invention. As an overall configuration and a manufacturing method of the semiconductor device according to the fourth embodiment are the same as in the first embodiment, a description thereof will be omitted here.

The semiconductor device according to the fourth embodiment is such that, in order to achieve an improvement in adhesion between the first molding resin 7 and second molding resin 8 and the inner lead, a surface-roughened inner lead 11 is used instead of the inner lead 6 used in the first embodiment. The surface-roughened inner lead 11 is such that a surface of an inner lead made of copper or a copper alloy is roughened chemically or physically to a surface roughness in the region of approximately Ra 0.06 to 0.2. Innumerable irregularities are formed on the surface of the surface-roughened inner lead 11, because of which a high anchoring effect is obtained.

The fourth embodiment is such that, in addition to the same advantages as in the first embodiment, the surface-roughened inner lead 11 is used, whereby adhesion to the first molding resin 7 and the second molding resin 8 improves more than when the normal inner lead 6 is used. Furthermore, the surface-roughened inner lead 11 has a greater surface area than the normal inner lead 6, because of which an improvement in heat dissipation is achieved.

Fifth Embodiment

Figure 18:
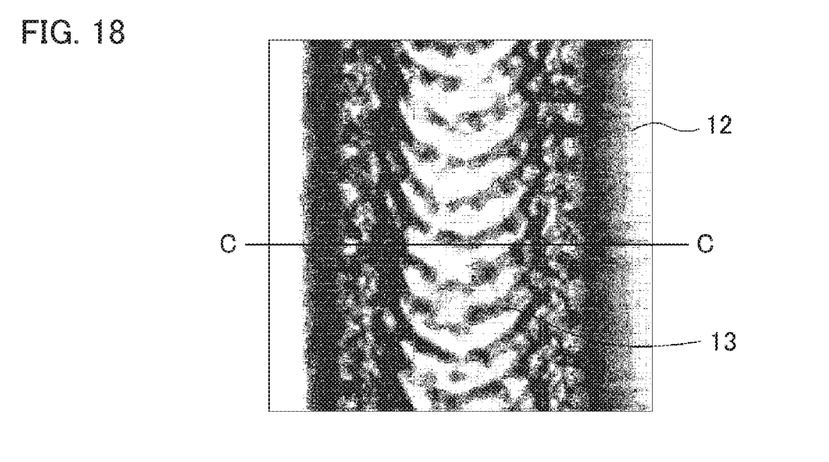
FIG. 18 is a plan view showing a scale-form portion of a laser-roughened inner lead in a fifth embodiment of the invention.
Figure 19:
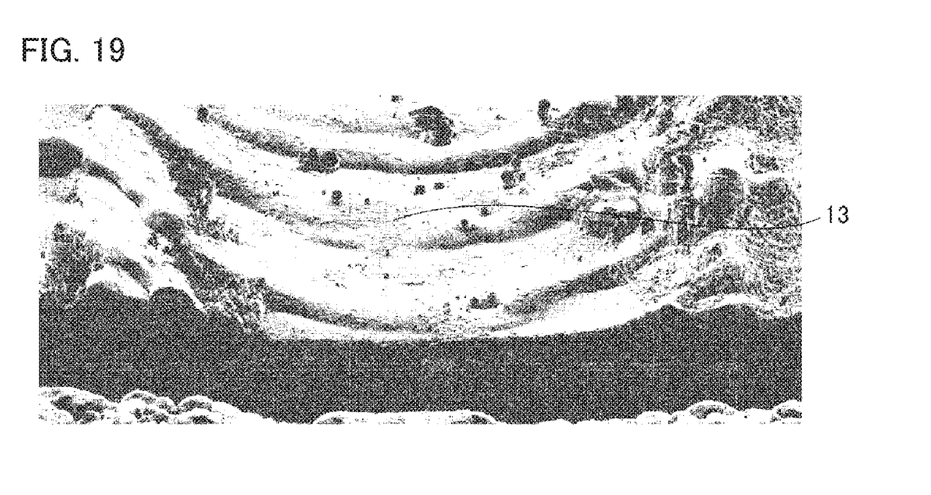
FIG. 19 is a top perspective view showing a scale-form portion of the laser-roughened inner lead in the fifth embodiment of the invention.

FIG. 18 is a plan view showing a scale-form portion of a laser-roughened inner lead in a fifth embodiment of the invention, and FIG. 19 is a top perspective view of a cross-section of a portion indicated by C-C in FIG. 18. As an overall configuration and a manufacturing method of a semiconductor device according to the fifth embodiment are the same as in the first embodiment, a description thereof will be omitted here.

The semiconductor device according to the fifth embodiment is such that, in order to achieve an improvement in adhesion between the first molding resin 7 and second molding resin 8 and the inner lead, a laser-roughened inner lead 12 is used instead of the inner lead 6 used in the first embodiment. The laser-roughened inner lead 12 has a scale-form portion 13 such that a surface form of a metal configuring the inner lead, or of a metal plating covering the surface of the inner lead, is transformed into a scale form. The scale-form portion 13 has a complex form wherein scale-like projections are disposed continuously, and both sides thereof are raised up high, because of which a high anchoring effect is obtained by disposing the scale-form portion 13.

The scale-form portion 13 is formed by causing a metal or a metal plating configuring the inner lead to melt by continuously carrying out spot irradiation using a laser, thereby transforming the metal or the metal plating into a scale form. The formation of the scale-form portion 13 on the inner lead can be carried out, for example, together with exposing the inner lead by laser irradiation after the first transfer step.

Also, as the scale-form portion 13 is formed using laser irradiation, the scale-form portion 13 can be selectively disposed in an arbitrary place on the inner lead, for example, a place on which stress is exerted when the semiconductor device is discharged from the molding die, and where initial detachment is liable to occur. A width and a height of the scale-form portion 13 can be regulated using an output, a scanning speed, or the like, of the laser. The width of the scale-form portion 13 is desirably 60 μm or greater, and adhesion can be further improved by increasing the width in accordance with an area of a place in which the scale-form portion 13 is disposed.

The fifth embodiment is such that, in addition to the same advantages as in the first embodiment, the laser-roughened inner lead 12 is used, whereby adhesion to the first molding resin 7 and the second molding resin 8 improves more than when the normal inner lead 6 is used. Also, the laser-roughened inner lead 12 has a greater surface area than the normal inner lead 6, because of which an improvement in heat dissipation is achieved.

Sixth Embodiment

Figure 20:
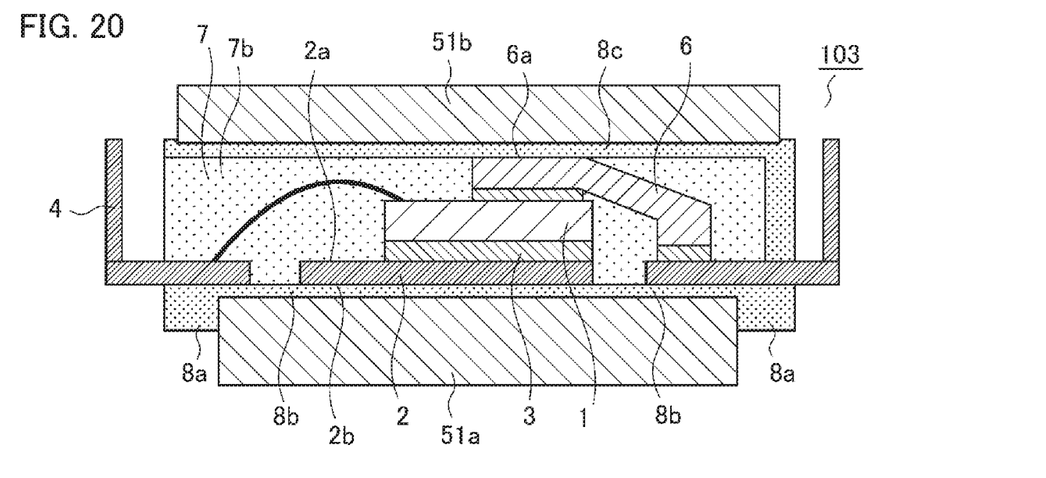
FIG. 20 is a sectional view showing a semiconductor device according to a sixth embodiment of the invention.
Figure 21:
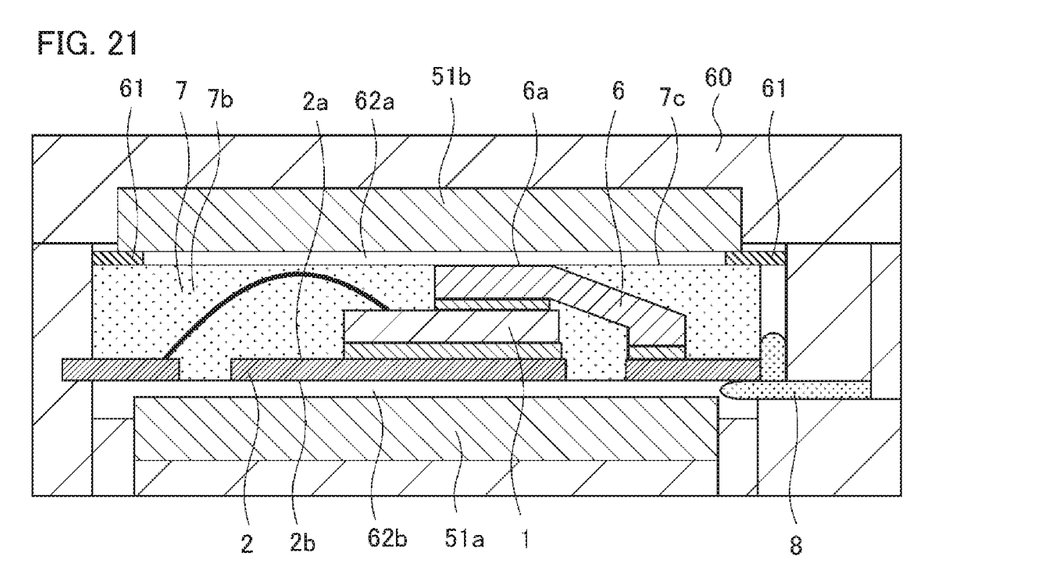
FIG. 21 is a sectional view showing a second transfer molding step of the semiconductor device according to the sixth embodiment of the invention.

FIG. 20 is a sectional view showing a semiconductor device according to a sixth embodiment of the invention, and FIG. 21 is a sectional view showing a second transfer molding step of the semiconductor device according to the sixth embodiment. A semiconductor device 103 according to the sixth embodiment is such that a heat dissipating face heatsink 51a and a mounting face heatsink 51b are joined directly to the first thin molded portion 8b and the second thin molded portion 8c respectively, with no intervening thermal grease or the like. As other configurations are the same as those of the semiconductor device 100 according to the first embodiment, a description thereof will be omitted here.

In the sixth embodiment, the heat dissipating face heatsink 51a and the mounting face heatsink 51b are installed in an interior of a molding die 60 during the second transfer molding step, as shown in FIG. 21. A cavity 62b corresponding to the first thin molded portion 8b is formed between the heat dissipating face 2b of the lead frame 2 and the heat dissipating face heatsink 51a in the interior of the molding die 60.

Also, a cavity 62a corresponding to the second thin molded portion 8c is formed between the element sealing portion 7b and the mounting face heatsink 51b using a movable pin 61 installed in the interior of the molding die 60. As the pin 61 is pulled out during molding, it does not happen that the second molding resin 8 flows late into a pinhole, and the pinhole opens.

In the same way as in the first embodiment, the second skirt portions 8a and the first thin molded portion 8b are formed on the heat dissipating face 2b, and the second thin molded portion 8c is formed on the mounting face 2a, using the second molding resin 8 in the second transfer molding step. At this time, the second molding resin 8 before curing that has flowed to the cavity 62a and the cavity 62b forms an adhesive, the heat dissipating face heatsink 51a is joined to the first thin molded portion 8b, and the mounting face heatsink 51b is joined to the second thin molded portion 8c.

The sixth embodiment is such that, in addition to the same advantages as in the first embodiment, the heat dissipating face heatsink 51a and the mounting face heatsink 51b are directly joined to the first thin molded portion 8b and the second thin molded portion 8c respectively, because of which thermal contact resistance decreases, and heat dissipation further improves. Also, a process of joining heatsinks to the first thin molded portion 8b and the second thin molded portion 8c across a thermal grease or the like after the second transfer molding step can be eliminated, in addition to which a reduction in material costs is achieved as thermal grease becomes unnecessary.

A form, a quantity, and a disposition of each component, for example, the semiconductor element 1, the external terminal 4, the wire 5, and the inner lead 6, of the semiconductor devices according to the first embodiment to the sixth embodiment, not being particularly limited, are selected as appropriate in accordance with a required function. The embodiments can be freely combined, and each embodiment can be modified or abbreviated as appropriate, without departing from the scope of the invention.

REFERENCE SIGNS LIST 1 semiconductor element, 2 lead frame, 2a mounting face, 2b heat dissipating face, 3 joining member, 4 external terminal, 5 wire, 6 inner lead, 6a end face, 7 first molding resin, 7a first skirt portion, 7b element sealing portion, 7c upper face, 7d third skirt portion, 8 second molding resin, 8a second skirt portion, 8b first thin molded portion, 8c second thin molded portion, 8d fourth skirt portion, 8e fifth skirt portion, 9 resin joint portion, 11 surface-roughened inner lead, 12 laser-roughened inner lead, 13 scale-form portion, 20 first molding die, 21, 31a, 31b, 31c, 41, 62a, 62b cavity, 22 upper gate, 30 second molding die, 32 lower gate, 40, 60 molding die, 42 film, 50a, 51a heat dissipating face heatsink, 50b, 51b mounting face heatsink, 61 pin, 100, 101, 102, 103 semiconductor device, 200, 201 inverter, 300, 301 motor, 400, 401 electric motor

The invention claimed is:

1. A semiconductor device comprising:
a lead frame on which a semiconductor element is mounted;
an inner lead connected to an electrode of the semiconductor element; and
a first resin and a second resin that seal one portion of the lead frame, the semiconductor element, and the inner lead, wherein,
when a face on a side of the lead frame on which the semiconductor element is mounted is assumed to be a mounting face and a face on a side opposite to that of the mounting face is assumed to be a heat dissipating face,
a frame-form projection is provided in an outer peripheral end portion of the heat dissipating face, two opposing sides of the frame-form projection and a first thin molded portion that covers a region between the two sides are integrally molded using the second resin, two other opposing sides of the frame-form projection are molded using the first resin,
an element sealing portion that covers one portion of the inner lead and the semiconductor element is molded on the mounting face using the first resin, and a second thin molded portion that covers one portion of a surface of the element sealing portion and the inner lead exposed in the element sealing portion is molded using the second resin,
wherein the frame-form projection is covered with the first resin and the second resin.

2. The semiconductor device according to claim 1, wherein the element sealing portion has a flat face parallel to the mounting face, a mounting face side frame-form projection is provided in an outer peripheral end portion of the flat face, two opposing sides of the mounting face side frame-form projection and a second thin molded portion that covers a region between the two sides are integrally molded using the second resin, and two other opposing sides of the mounting face side frame-form projection are molded using the first resin.

3. The semiconductor device according to claim 2, wherein two sides of the mounting face side frame-form projection molded using the first resin are covered with the second resin.

4. The semiconductor device according to claim 1, wherein the element sealing portion has a flat face parallel to the mounting face, in addition to which the inner lead has an end face parallel to the flat face, and heights of the flat face and the end face from the mounting face are equal.

5. The semiconductor device according to claim 4, wherein the second thin molded portion covers the flat face of the element sealing portion and the end face of the inner lead exposed in the flat face.

6. The semiconductor device according to claim 1, wherein a surface of the inner lead is roughened.

7. The semiconductor device according to claim 1, wherein the inner lead has a scale-form portion in which scale-like projections are disposed continuously.

8. The semiconductor device according to claim 1, wherein the second resin is a high heat dissipating resin whose thermal conductivity is higher than that of the first resin.

9. The semiconductor device according to claim 1, comprising heatsinks joined directly to the first thin molded portion and the second thin molded portion.

10. A power conversion device including an inverter that includes one or more semiconductor devices and a motor, wherein each of the one or more semiconductor devices comprises:
   a lead frame on which a semiconductor element is mounted;
   an inner lead connected to an electrode of the semiconductor element; and
   a first resin and a second resin that seal one portion of the lead frame, the semiconductor element, and the inner lead,
   when a face on a side of the lead frame on which the semiconductor element is mounted is assumed to be a mounting face and a face on a side opposite to that of the mounting face is assumed to be a heat dissipating face,
   a frame-form projection is provided in an outer peripheral end portion of the heat dissipating face, two opposing sides of the frame-form projection and a first thin molded portion that covers a region between the two sides are integrally molded using the second resin, two other opposing sides of the frame-form projection are molded using the first resin,
   an element sealing portion that covers one portion of the inner lead and the semiconductor element is molded on the mounting face using the first resin, and a second thin molded portion that covers one portion of a surface of the element sealing portion and the inner lead exposed in the element sealing portion is molded using the second resin,
   wherein the frame-form projection is covered with the first resin and the second resin, and
   heatsinks are disposed on the first thin molded portion and the second thin molded portion of the semiconductor device, and each of the heatsinks is one portion of a frame body of the inverter or the motor.

11. A power conversion device including an inverter that includes one or more semiconductor devices, and a motor, wherein each of the one or more semiconductor devices comprises:
   a lead frame on which a semiconductor element is mounted;
   an inner lead connected to an electrode of the semiconductor element; and
   a first resin and a second resin that seal one portion of the lead frame, the semiconductor element, and the inner lead,
   when a face on a side of the lead frame on which the semiconductor element is mounted is assumed to be a mounting face and a face on a side opposite to that of the mounting face is assumed to be a heat dissipating face,
   a frame-form projection is provided in an outer peripheral end portion of the heat dissipating face, two opposing sides of the frame-form projection and a first thin molded portion that covers a region between the two sides are integrally molded using the second resin, two other opposing sides of the frame-form projection are molded using the first resin,
   an element sealing portion that covers one portion of the inner lead and the semiconductor element is molded on the mounting face using the first resin, and a second thin molded portion that covers one portion of a surface of the element sealing portion and the inner lead exposed in the element sealing portion is molded using the second resin,
   wherein the frame-form projection is covered with the first resin and the second resin, and
   heatsinks are disposed on the first thin molded portion and the second thin molded portion of the semiconductor device, and each of the heatsinks is joined to a frame body of the inverter or the motor.

12. A semiconductor device comprising:
   a lead frame on which a semiconductor element is mounted;
   an inner lead connected to an electrode of the semiconductor element; and
   a first resin and a second resin that seal one portion of the lead frame, the semiconductor element, and the inner lead, wherein,
   when a face on a side of the lead frame on which the semiconductor element is mounted is assumed to be a mounting face and a face on a side opposite to that of the mounting face is assumed to be a heat dissipating face,
   a frame-form projection is provided in an outer peripheral end portion of the heat dissipating face, two opposing sides of the frame-form projection and a first thin molded portion that covers a region between the two sides are integrally molded using the second resin, two other opposing sides of the frame-form projection are molded using the first resin,
   an element sealing portion that covers one portion of the inner lead and the semiconductor element is molded on the mounting face using the first resin, and a second thin molded portion that covers one portion of a surface of the element sealing portion and the inner lead exposed in the element sealing portion is molded using the second resin,
   wherein the element sealing portion has a flat face parallel to the mounting face, a mounting face side frame-form projection is provided in an outer peripheral end portion of the flat face, two opposing sides of the mounting face side frame-form projection and a second thin molded portion that covers a region between the two sides are integrally molded using the second resin, and two other opposing sides of the mounting face side frame-form projection are molded using the first resin,
   wherein the frame-form projection is covered with the first resin and the second resin, and
   the mounting face side frame-form projection is covered with the first resin and the second resin.

* * * * *

UNITED STATES PATENT AND TRADEMARK OFFICE
CERTIFICATE OF CORRECTION

PATENT NO. : 11,302,597 B2
APPLICATION NO. : 16/617233
DATED : April 12, 2022
INVENTOR(S) : Takanobu Kajihara et al.

It is certified that error appears in the above-identified patent and that said Letters Patent is hereby corrected as shown below:

In the Claims

In Claim 1, Column 14, Lines 41 and 42, delete "wherein the frame-form projection is covered with the first resin and the second resin." and insert --wherein two sides of the frame-form projection molded using the first resin are covered with the second resin.--

In Claim 10, Column 15, Lines 41 and 42, delete "wherein the frame-form projection is covered with the first resin and the second resin, and" and insert --two sides of the frame-form projection molded using the first resin are covered with the second resin, and--

In Claim 11, Column 16, Lines 14 and 15, delete "wherein the frame-form projection is covered with the first resin and the second resin, and" and insert --two sides of the frame-form projection molded using the first resin are covered with the second resin, and--

In Claim 12, Column 16, Lines 59-62, delete "wherein the frame-form projection is covered with the first resin and the second resin, and
    the mounting face side frame-form projection is covered with the first resin and the second resin." and insert --wherein two sides of the mounting face side frame-form projection molded using the first resin are covered with the second resin.--

Signed and Sealed this
Sixth Day of September, 2022

Katherine Kelly Vidal
*Director of the United States Patent and Trademark Office*